(12) United States Patent
Glova et al.

(10) Patent No.: US 10,199,433 B2
(45) Date of Patent: Feb. 5, 2019

(54) ELECTRONIC DEVICE AND METHOD FOR FABRICATING THE SAME

(71) Applicant: SK hynix Inc., Icheon-Si (KR)

(72) Inventors: Alvin Oliver Glova, Icheon-si (KR); Joon-Seop Sim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/467,329

(22) Filed: Mar. 23, 2017

(65) Prior Publication Data

US 2018/0040670 A1    Feb. 8, 2018

(30) Foreign Application Priority Data

Aug. 8, 2016   (KR) .................. 10-2016-0100830

(51) Int. Cl.
| | |
|---|---|
| *H01L 27/22* | (2006.01) |
| *H01L 43/08* | (2006.01) |
| *H01L 27/24* | (2006.01) |
| *H01L 45/00* | (2006.01) |
| *G06F 12/0802* | (2016.01) |

(52) U.S. Cl.
CPC ...... *H01L 27/2436* (2013.01); *G06F 12/0802* (2013.01); *H01L 45/1233* (2013.01); *H01L 45/1675* (2013.01); *G06F 2212/1016* (2013.01); *G06F 2212/222* (2013.01); *G06F 2212/60* (2013.01)

(58) Field of Classification Search
CPC ....... H01L 27/222; H01L 43/02; H01L 43/08; H01L 43/12; G11C 11/14–11/16; G11C 11/161

See application file for complete search history.

(56) References Cited

U.S. PATENT DOCUMENTS

| | | | |
|---|---|---|---|
| 7,875,492 B2 | 1/2011 | Gruening-von Schwerin et al. | |
| 7,894,246 B2 * | 2/2011 | Ueda .................. | G11C 11/15 257/421 |
| 8,138,562 B2 | 3/2012 | Mao | |
| 9,105,572 B2 * | 8/2015 | Kanaya ............... | H01L 27/222 |
| 2014/0117477 A1 * | 5/2014 | Park .................... | H01L 43/08 257/421 |
| 2014/0258626 A1 * | 9/2014 | Kang .................. | H01L 45/1253 711/125 |

* cited by examiner

*Primary Examiner* — Allison Bernstein
(74) *Attorney, Agent, or Firm* — Perkins Coie LLP

(57) ABSTRACT

Provided is an electronic device including a semiconductor memory. The semiconductor memory may include: a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer.

20 Claims, 15 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2016-0100830, entitled "ELECTRONIC DEVICE AND METHOD FOR FABRICATING THE SAME" and filed on Aug. 8, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAIVI (magnetic random access memory), an E-fuse, etc.

SUMMARY

The disclosed technology in this patent document includes memory circuits or devices and their applications in electronic devices or systems and various implementations of an electronic device which can secure characteristics of a variable resistance element and fabricating processes are easy.

In one aspect, there is provided an electronic device including a semiconductor memory. The semiconductor memory may include: a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer.

In another aspect, an electronic device comprising a semiconductor memory is provided wherein the semiconductor memory comprises: a variable resistance element including a first portion having a first shape and including a free layer which exhibits a variable magnetization direction, a second portion having a second shape different from the first shape, disposed over the first portion and including a pinned layer with a pinned magnetization direction, and a tunnel barrier layer interposed between the free layer and the pinned layer.

Implementations of the above electronic device may include one or more the following.

A width of the first portion decreases from top to bottom, and a width of the second portion increases from top to bottom in a direction crossing the extending direction of the second portion. The second portion is shaped to extend along an extended direction, a width of the first portion along a direction perpendicular to the extended direction decreases from a top to a bottom of the first portion along a vertical direction perpendicular to the extended direction, and a width of the second portion along the direction perpendicular to the extended direction increases from a top of the second portion to a bottom of the second portion along the vertical direction. The tunnel barrier layer is included in the first portion and has a sidewall aligned with a sidewall of the free layer. The tunnel barrier layer is included in the second portion and has a sidewall aligned with a sidewall of the pinned layer. The semiconductor memory further comprises: a lower contact plug coupled to the first portion under the first portion. The lower contact plug has a sidewall aligned with a sidewall of the first portion. The semiconductor memory further comprises: an upper contact plug coupled to the second portion over the second portion. The upper contact plug has an island shape overlapping the first portion. The upper contact plug has a line shape overlapping the second portion. The semiconductor memory further comprises: a conductive line coupled to the upper contact plug over the upper contact plug while having a line shape which overlaps the second portion. The first portion includes a plurality of first portions which are arranged in the direction, and the second portion commonly overlaps the plurality of first portions. The semiconductor memory further comprises: a plurality of transistors coupled to the plurality of first portions, respectively, and a magnetization direction of a free layer of a selected first portion of the plurality of first portions, which is coupled to a turned-on transistor of the plurality of transistors, changes. The second portion further comprising: a magnetic correction layer disposed over the pinned layer and offsetting or reducing an effect of a stray field generated by the pinned layer; and an exchange coupling layer interposed between the pinned layer and the magnetic correction layer. The first portion is filled in a hole of an interlayer insulating layer, and the second portion is located over the interlayer insulating layer. The first portion includes a plurality of first portions which are arranged in the direction, and the second portion commonly overlaps the plurality of first portions. The semiconductor memory further comprises: a plurality of transistors coupled to the plurality of first portions, respectively, and a magnetization direction of a free layer of a selected first portion of the plurality of first portions, which is coupled to a turned-on transistor of the plurality of transistors, changes.

In another aspect, an electronic device comprising a semiconductor memory is provided to comprise: variable resistance elements to store data, each variable resistance element including first portions arranged to be spaced apart from one another in a direction and including a free layer with a variable magnetization direction, a second portion disposed over the first portion to overlap the first portion and including a pinned layer with a pinned magnetization direction, wherein second portions of the variable resistance elements form an integral structure extending along the direction; and transistors coupled to the variable resistance elements, respectively, each transistor being coupled to a first portion of a corresponding variable resistance element to turn on or off an electrical current through the corresponding variable resistance, wherein, in a write operation, the electrical current is used to change the variable magnetization direction of the free layer in the first portion of the corresponding variable resistance element.

In some implementations, each second portion of the variable resistance elements has a sidewall surface forming an inclination angle with regard to a perpendicular line to a bottom surface of second portion, the inclination angle being less than that of a variable resistance element without the second portion. In some implementations, the first portion has a width increasing away from a top surface of the first portion and the second portion has a width decreasing away from the top surface of the first portion. In some implementations, each variable resistance element further comprises a tunnel barrier layer between the free layer and the pinned layer included in the first portion or in the second portion. In some implementations, the pinned layer has a width not less than that of the free layer. In some implementations, the first portion has an island shape. In some implementations, the second portion has a line shape.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming an interlayer insulating layer over a substrate; performing a first process to form a first portion of a variable resistance element in the interlayer insulating layer, the first portion having an island shape and including a free layer which has a variable magnetization direction; and subsequently performing a second process to form a second portion of the variable resistance element over the interlayer insulating layer and the first portion, the second portion having a line shape which extends in a direction and including a pinned layer which has a pinned magnetization direction, and forming a tunnel barrier layer between the free layer and the pinned layer.

Implementations of the above method may include one or more the following.

The forming of the first portion comprises: forming an opening by selectively etching the interlayer insulating layer; and locating the first portion in the opening to fill a portion of the opening. The forming of the tunnel barrier layer includes locating the tunnel barrier layer in the opening to dispose over the free layer. The method further comprising: forming a lower contact plug to fill another portion of the opening, before the forming of the first portion, and wherein the first portion is disposed over the lower contact plug. The forming of the second portion comprises: depositing one or more material layers including the pinned layer; and selectively etching the material layers. The forming of the second portion comprises: selectively etching the tunnel barrier layer. The one or more material layers include the tunnel barrier layer and the tunnel barrier layer is formed by selectively etching the material layers. The material layers further include an exchange coupling layer located over the pinned layer, and a magnetic correction layer located over the exchange coupling layer. The method further comprising: forming an upper contact plug which is disposed over the second portion to be coupled to the second portion, after the forming of the second portion. The upper contact plug has an island shape overlapping the first portion. The upper contact plug has a line shape overlapping the second portion. The method further comprising: forming a conductive line which is coupled to the upper contact plug over the upper contact plug and has a line shape overlapping the second portion, after the forming of the upper contact plug. The forming of the second portion and the forming of the conductive line are performed by etching processes using a same mask.

These and other aspects, implementations and associated advantages are described in greater detail in the drawings, the description and the claims.

DETAILED DESCRIPTION

Figure 1A:
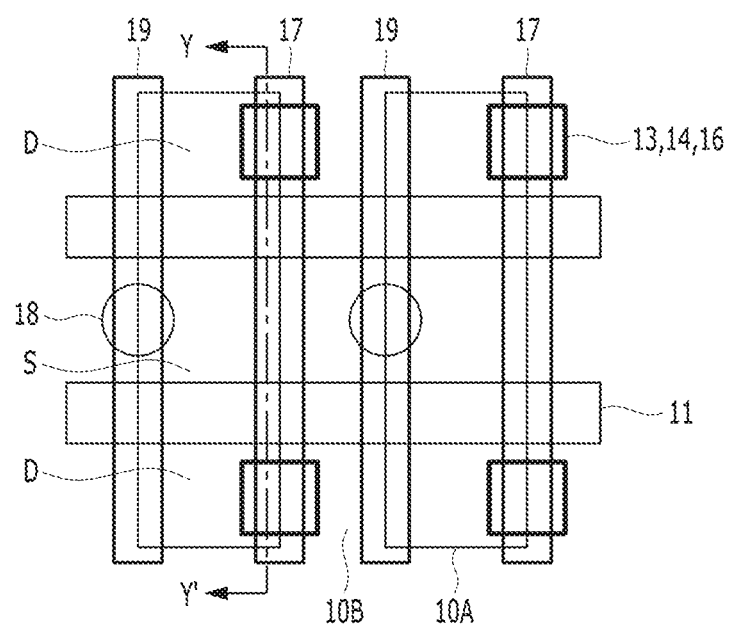
FIGS. 1A and 1B are views illustrating comparative examples of a semiconductor memory and its fabricating method.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing implementations of the disclosed technology, comparative examples of a semiconductor memory and its fabricating method will be described.

Figure 1B:
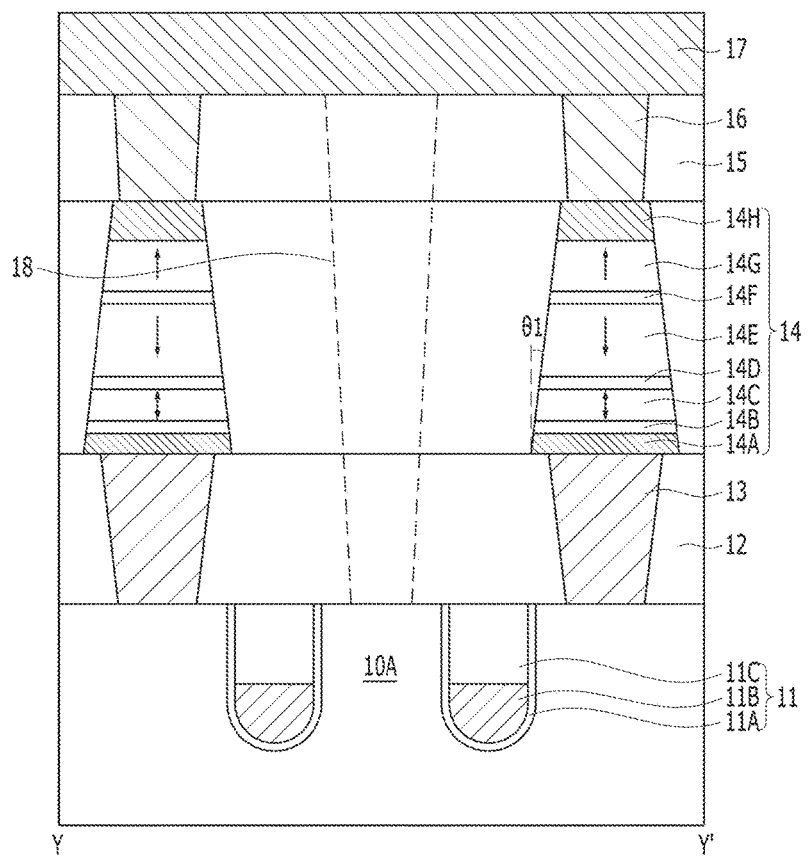

FIGS. 1A and 1B are views illustrating a semiconductor memory of a comparative example and a method for fabricating the same. FIG. 1A shows a planar view, and FIG. 1B shows a cross-sectional view taken along a line Y-Y' of FIG. 1A.

Referring to FIGS. 1A and 1B, an isolation layer 10B may be formed in a semiconductor substrate 10 to define an active region 10A.

A gate structure 11 which extends in a first direction crossing the active region 10A may be formed in the semiconductor substrate 10. The gate structure 11 may include a gate insulating layer 11A, a gate electrode 11B and a gate protective layer 11C.

A source region S and a drain region D may be formed in the active region 10A at both sides of the gate structure 11, respectively.

A stack structure of a lower contact plug 13, a variable resistance element 14 and an upper contact plug 16 may be formed over the semiconductor substrate 10 to be coupled to the drain region D. A source line contact plug 18 may be formed over the semiconductor substrate 10 to be coupled to the source region S.

A bit line 17 may be formed over the upper contact plug 16 to be coupled to the upper contact plug 16 and extend in a second direction parallel to the active region 10A. A source line 19 may be formed over the source line contact plug 18 to be coupled to the source line contact plug 18 and extend in the second direction.

Reference numerals 12 and 15 may indicate a first interlayer insulating layer and a second interlayer insulating layer, respectively.

In this semiconductor memory, the variable resistance element 14 is structured to exhibit different resistance states of different resistance values for representing different data for data storage. A resistance state of the variable resistance element 14 may be changed by applying a voltage or current of a sufficient magnitude through the source line 19 and the bit line 17 in a data write operation. Therefore, the variable resistance element 14 is capable of storing different data. Here, the gate structure 11 and the source/drain regions S and D located at both sides of the gate structure 11 may form a transistor, and the transistor may serve as a selection element which controls an access to a selected variable resistance element 14.

The variable resistance element 14 may have a multi-layered structure. Specifically, the variable resistance element 14 may include an MTJ (Magnetic Tunnel Junction) structure which includes a free layer 14C having a variable magnetization direction, a pinned layer 14E having a pinned magnetization direction, and a tunnel barrier layer 14D interposed between the free layer 14C and the pinned layer 14E and allowing tunneling of electrons if necessary, and various layers for improving characteristics of the MTJ structure and fabricating processes. The various layers may include, for example, a lower electrode layer 14A, a seed layer 14B, an exchange coupling layer 14F, a magnetic correction layer 14G, and/or an upper electrode layer 14H, etc.

The variable resistance element 14 may be formed by sequentially depositing material layers for forming the multi-layered structure, and selectively etching the material layers to have an island shape. This etching process may be performed by a physical etching method such as an IBE (Ion-beam etching). This is for reducing a damage to a sidewall of the variable resistance element 14 that occurs during a chemical etching process. In this case, a width of the variable resistance element 14 may increase from top to bottom due to characteristics of the physical etching method, so the sidewall of the variable resistance element 14 may have a sloped profile instead of a vertical profile. Referring to FIG. 1B, an angle θ1 between a dotted line perpendicular to a top surface of the semiconductor substrate 10 and the sidewall of the variable resistance element 14 may be at various values and could be relatively large in some implementations. The slope may be increased or deepened as a thickness of an etch target increases for a particular etching process, increases, e.g., when the number of layers included in the variable resistance element 14 increases.

Therefore, the reliability or magnetic/electrical characteristics of the MTJ structure may be deteriorated when the thickness of the MTC structure increases due to the evitable increase in the slope of the MTJ side profile caused by the etching process. It is well known that the reliability and the magnetic/electrical characteristics of the MTJ structure is excellent when the sidewall of the MTJ structure is relatively vertical while the characteristics of the MTJ structure is deteriorated when the sidewall of the MTJ structure is inclined with a slope. Also, in the example shown in FIG. 1B where the free layer 14C is positioned closer to the semiconductor substrate 10 and the pinned layer 14E is placed above the free layer 14C, the slope created by the etching can cause a width of the free layer 14C which is located at a relatively lower portion of the MTJ stack is greater than a width of the pinned layer 14E and/or the magnetic correction layer 14G which located at a higher position in the MTJ stack. This condition of the MTJ structure caused by the presence of the sloped side profile of the MTJ structure can reduce the pinning effect by the pinned layer 14E. Accordingly, the efficiency of a data writing operation in such a sloped MTJ structure may be reduced. Furthermore, in the specific MTC structure in FIG. 1B, the magnetic correction layer 14G is located above the pinned layer 14E in the relatively upper portion of the MTC structure and the slope of the MTJ structure would cause the width of the magnetic correction layer 14G to be the smaller than the widths of the layers 14E and 14C, this slope-induced small width of the magnetic correction layer 14G may cause the magnetic correction effect to be insufficient at the free layer 14C so that the layer 14G cannot properly offset or reduce an effect of a stray field generated by the pinned layer 14E.

Moreover, in forming the variable resistance element 14 which has an island shape, it is generally difficult to form the variable resistance element 14 using one island-type mask for the desired island shape. Because of miniaturization trends toward smaller sizes of elements within a semiconductor memory, it is required to form the variable resistance element 14 using two line-type masks at the intersection of the two line-type masks. Because of the increase in the number of the masks (i.e., using two line-type masks instead of a single island shape mask), the processing cost and processing time may greatly increase.

The disclosed technology provides present implementations of a semiconductor memory and its fabricating method which can solve the above problems.

FIGS. 2A to 6C are views illustrating a semiconductor memory and a method for fabricating the same in accordance with an implementation. FIGS. 2A, 3A, 4A, 5A and 6A show planar views, FIGS. 2B, 3B, 4B, 5B and 6B show crossing-sectional views taken along lines X-X' of FIGS. 2A, 3A, 4A, 5A and 6A, respectively, and FIGS. 2C, 3C, 4C, 5C and 6C show crossing-sectional views taken along lines Y-Y' of FIGS. 2A, 3A, 4A, 5A and 6A, respectively.

First, a fabricating method will be described.

Figure 2A:
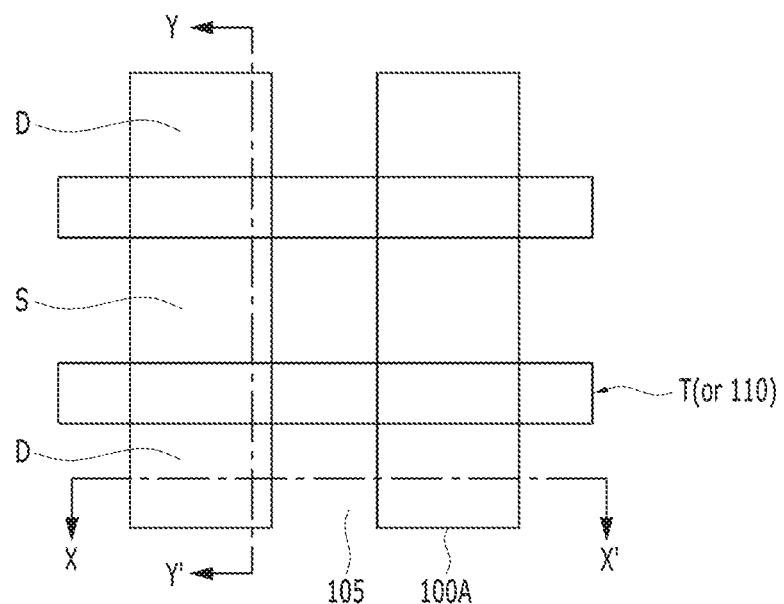
FIGS. 2A to 6C are views illustrating a semiconductor memory and a method for fabricating the same in accordance with an implementation of the disclosed technology.
Figure 2B:
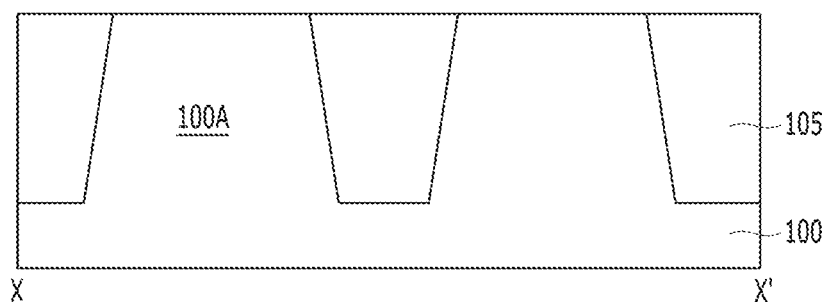
Figure 2C:
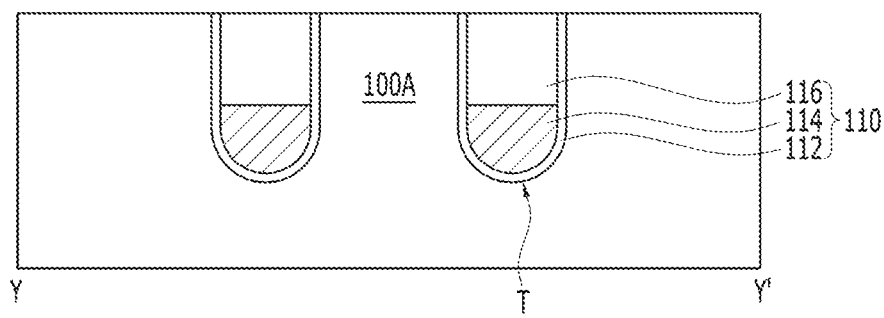

Referring to FIGS. 2A to 2C, a semiconductor substrate 100 may be provided. The semiconductor substrate 100 may include a semiconductor material such as a silicon, etc.

Then, an active region 100A of the semiconductor substrate 100 may be defined by forming an isolation layer 105 in the semiconductor substrate 100. The isolation layer 105 may be formed by forming an isolation trench by selectively etching an isolation region of the semiconductor substrate 100 and filling the isolation trench with an insulating material such as a silicon oxide, a silicon nitride, etc.

In this implementation, a plurality of active regions 100A may be arranged to be separated from one another in a first direction, for example, in a direction parallel to the line X-X', and each of the active regions 100A may have a line shape which extends in a second direction crossing the first direction, for example, in a direction parallel to the line Y-Y'. However, shapes, numbers and arrangements of the active regions 100A may be variously modified.

Then, a gate trench T may be formed by forming a mask pattern (not shown) exposing a gate forming region over the semiconductor substrate 100, and etching the active region 100A and the isolation layer 105 using the mask pattern as an etching barrier. The gate trench T may provide a space in which a gate of a transistor is to be formed.

In this implementation, a plurality of gate trenches T may be arranged to be separated from one another in the second direction, and each of the gate trenches T may extend in the first direction to cross the active regions 100A. However, shapes, numbers and arrangements of the gate trenches T may be variously modified.

Then, a gate insulating layer 112 may be formed along an inner wall of the gate trench T. The gate insulating layer 112 may be formed by a thermal oxidation process or a deposition process of an insulating material, and include a silicon oxide, etc.

Then, a gate electrode 114 may be formed to fill a lower portion of the gate trench T in which the gate insulating layer 112 is formed. The gate electrode 114 may be formed by forming a conductive material such as a metal, a metal nitride or other suitable materials to a thickness sufficient to fill the gate trenches T in which the gate insulating layer 112 is formed, and performing an etch back process until the conductive material has a desired height.

Then, a gate protective layer 116 may be formed over the gate electrode 114. The gate protective layer 116 may be formed by forming an insulating material to cover a resultant structure in which the gate electrode 114 is formed, and performing a planarization process, for example, a CMP (Chemical Mechanical Polishing) or an etch back until a top surface of the semiconductor substrate 100 is exposed. The gate protective layer 116 may be formed of an insulating material such as a silicon nitride, a silicon oxynitride, a combination thereof, etc.

As a result, a gate structure 110 which is filled in the gate trench T and includes the gate insulating layer 112, the gate electrode 114 and the gate protective layer 116 may be formed. In this implementation, the entirety or the whole structure of the gate structure 110 may be filled in the gate trench T. However, in other implementations, a portion of the gate structure 110 may fill the gate trench T and a remaining portion of the gate structure 110 may protrude over the semiconductor substrate 100. Alternatively, the entirety or the whole structure of the gate structure 110 may be formed over the semiconductor substrate 100. In this case, the gate structure 110 may have a stack structure in which the gate insulating layer 112, the gate electrode 114 and the gate protective layer 116 are sequentially stacked over the semiconductor substrate 100.

Then, impurities may be implanted into the active regions 100A at both sides of the gate structure 110 to form junction regions. The junction region located at one side of the both sides of the gate structure 110 may serve as a source region S, and the junction region located at the other side of the both sides of the gate structure 110 may serve as a drain region D. In this implementation, the source region S may be located between two gate structures 110 and the drain region D may be located at each of both sides of the two gate structures 110. However, in another implementation, locations of the source region S and the drain region D may be reversed to each other.

As a result, a transistor including the gate structure 110, the source region S and the drain region D may be formed. Two transistors which are adjacent to each other in the second direction may share the source region S. This transistor may be coupled to a variable resistance element which will be described later and serve as a selection element which controls an access to the variable resistance element.

Figure 3A:
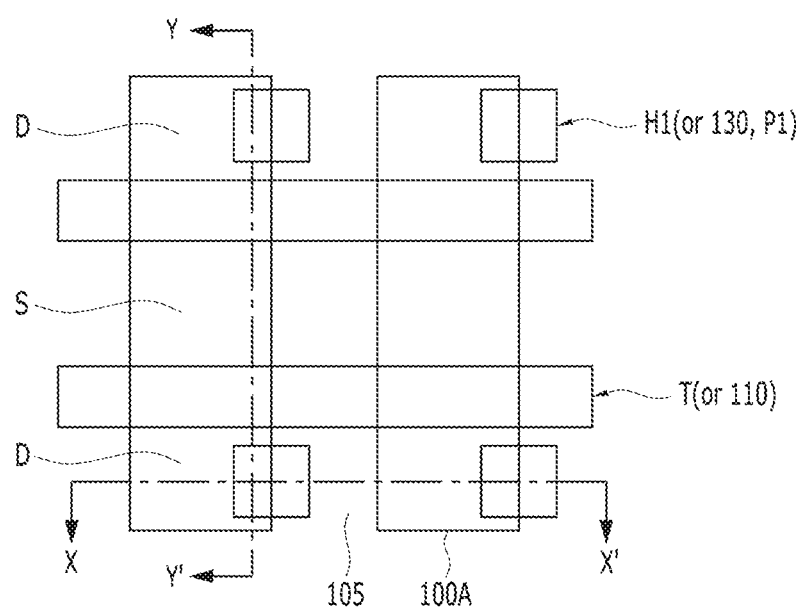
Figure 3B:
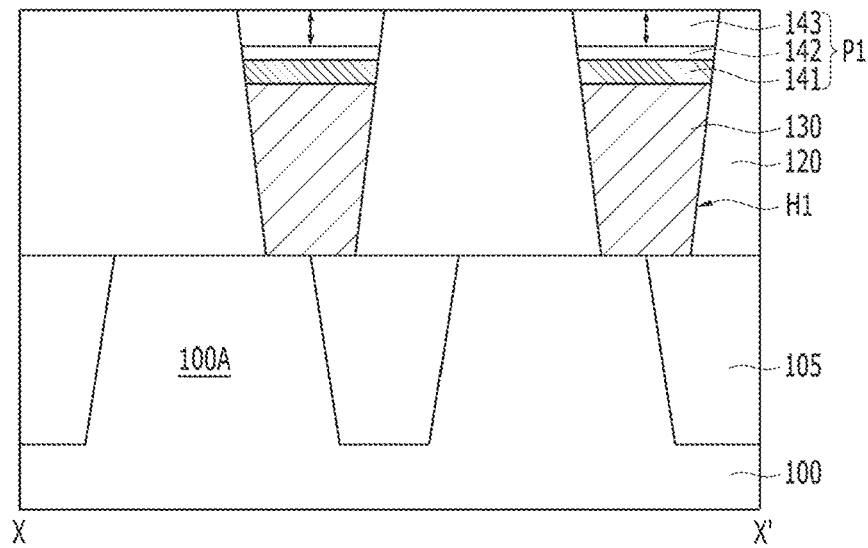
Figure 3C:
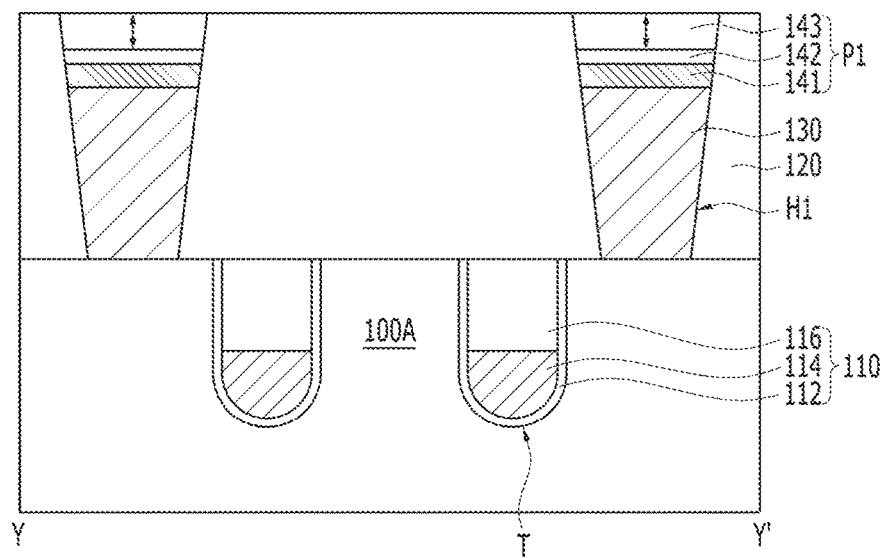

Referring to FIGS. 3A to 3C, a first interlayer insulating layer 120 may be formed over a resultant structure of FIGS. 2A to 2C, and then, a first hole H1 exposing one of two junction regions of the transistor, for example, each of the drain regions D may be formed by selectively etching the first interlayer insulating layer 120. Although an opening structure passing through the first interlayer insulating layer 120 is described as the hole H1, other implementations are also possible. The etching process for forming the first hole H1 may be performed by a dry etching process so as to cause the first hole H1 to have a width which decreases from top to bottom.

Then, a lower contact plug 130 may be formed to fill a lower portion of the first hole H1. The lower contact plug 130 may be formed by depositing a conductive material to a thickness sufficient to fill the first hole H1, and performing an etch back process until the conductive material has a height lower than a top surface of the first interlayer insulating layer 120. The lower contact plug 130 may have a single-layered structure or multi-layered structure including a conductive material which has an excellent gap-fill characteristic and a high electrical conductivity, for example, a metal such as W or Ta, a metal nitride such as TiN, etc.

Then, a first portion P1 of a variable resistance element may be formed to fill a remaining space of the first hole H1 in which the lower contact plug 130 is formed. For reference, the variable resistance element may store data based on the resistance state of the element and different resistance states are used to store different data. The resistance state can be changed by switching between different resistance states by applying a sufficient writing voltage or current to its both ends. Specially, in this implementation, the variable resistance element may include at least an MTJ structure. The MTJ structure may include a free layer having a variable magnetization direction, a pinned layer having a pinned magnetization direction, and a tunnel barrier layer interposed between the free layer and the pinned layer and allowing tunneling of electrons. The different relative magnetization directions of the pinned and free layers in the MTJ generate different resistance states of the MTJ structure. For example, during a data writing operation, a sufficiently large writing voltage or current applied across the MTJ structure can change the direction of the magnetization of the free layer and thus changes the resistance state of the variable resistance element. The MTJ structure may have different resistance states according to whether the magnetization directions of the free layer and the pinned layer are parallel to each other or not.

In this implementation, the first portion P1 may include at least a free layer 143 of an MTJ structure. The free layer 143 may have a single-layered structure or multi-layered structure which includes a ferromagnetic material. For example, the free layer 143 may include an alloy of which a main component is Fe, Ni or Co such as Fe—Pt alloy, Fe—Pd alloy, Co—Fe ally, Co—Pd alloy, Co—Pt alloy, Co—Fe—Ni alloy, Fe—Ni—Pt alloy, Co—Fe—Pt alloy, Co—Ni—Pt alloy, or Co—Fe—B alloy, or a stack structure such as Co/Pt, Co/Pd, etc. As shown in FIG. 3B, a magnetization direction of the free layer 143 may be substantially perpendicular to an interface between layers which constitute the variable resistance element, for example, to an interface between the free layer 143 and a seed layer 142 which will be described later. That is, the magnetization direction of the free layer 143 may be changed between its two opposite magnetization directions, e.g., in the illustrated example shown in FIG. 3B, an upward direction and a downward direction by Spin Transfer Torque. Since the free layer 143 is filled in the first hole H1 together with the lower contact plug 130, the free layer 143 may have a sidewall aligned with a sidewall of the lower contact plug 130.

Moreover, the first portion P1 may further include the seed layer 142 which is located under the free layer 143 and helps the free layer 143 grow to have a desired crystal structure and/or lattice structure. For example, the seed layer 142 may have a certain crystal structure to improve a perpendicular magnetic crystalline anisotropy of the free layer 143 located thereover. The seed layer 142 may include a metal containing material. For example, the seed layer 142 may have a single-layered structure or multi-layered structure including a metal such as Hf, Mg, Zr, Nb, Mo, Ta, W or Ti, an oxide of this metal, or a nitride of this metal.

Moreover, the first portion P1 may further include a lower electrode layer 141 which is located under the seed layer 142 and constitutes a lowermost portion of the variable resistance element. The lower electrode layer 141 may be a portion of the variable resistance element, and be distinguished from the lower contact plug 130 which is coupled to a bottom end of the variable resistance element for connecting the variable resistance element with other elements. The lower electrode layer 141 may include a material which has a high electrical conductivity and does not affect the crystal structure of the seed layer 142. For example, the lower electrode layer 141 may include an amorphous metal containing material, for example, an amorphous Ta.

The first portion P1 including the lower electrode layer 141, the seed layer 142 and the free layer 143 may be formed by depositing a conductive material for the lower electrode layer 141 to a thickness sufficient to fill the first hole H1 in which the lower contact plug 130 is formed, performing an etch back process until the conductive material for the lower electrode layer 141 has a height lower than a top surface of the first interlayer insulating layer 120, depositing a conductive material for the seed layer 142 to a thickness sufficient to fill the first hole H1 in which the lower contact plug 130 and the lower electrode layer 141 are formed, performing an etch back process until the conductive material for the seed layer 142 has a height lower than the top surface of the first interlayer insulating layer 120, depositing a ferromagnetic material for the free layer 143 to a thickness sufficient to fill the first hole H1 in which the lower contact plug 130, the lower electrode layer 141 and the seed layer 142 are formed, and performing a planarization process until the top surface of the first interlayer insulating layer 120 is exposed. Since the first portion P1 is patterned by the first hole H1 which is already formed, an additional mask process for patterning the first portion P1 may not be necessary.

As a result, a stack structure including the lower contact plug 130 and the first portion P1 of the variable resistance element may be formed in the first hole H1 and the side profile of this stack structure in the first hole H1 conforms to the side profile of the first hole H1 to have a width that decreases in the vertical direction from the top to the bottom towards the contact plug 130. A bottom surface of the lower contact plug 130 may be coupled to the drain region D and the top surface of the lower contact plug 130 may be coupled to the first portion P1. A plurality of first portions P1 may be coupled to a plurality of drain regions D through the lower contact plug 130, respectively.

Although the first portion P1 includes the lower electrode layer 141, the seed layer 142 and the free layer 143 in this implementation, a configuration of the first portion P1 may be modified in various manners as long as the first portion P1 includes the free layer 143. For example, the lower electrode layer 141 and/or the seed layer 142 may be omitted in the first portion P1. Alternatively, for example, the first portion P1 may further include one or more additional layers.

Also, although the lower contact plug 130 and the first portion P1 are formed in the first hole H1 so as to have sidewalls aligned with each other, other implementations may be also possible. For example, the first portion P1 and the lower contact plug 130 may be located in different holes to fill the different holes. In this case, the sidewall of the first portion P1 may not be aligned with the sidewall of the lower contact plug 130 while the first portion P1 is coupled to the lower contact plug 130 over the lower contact plug 130.

Figure 4A:
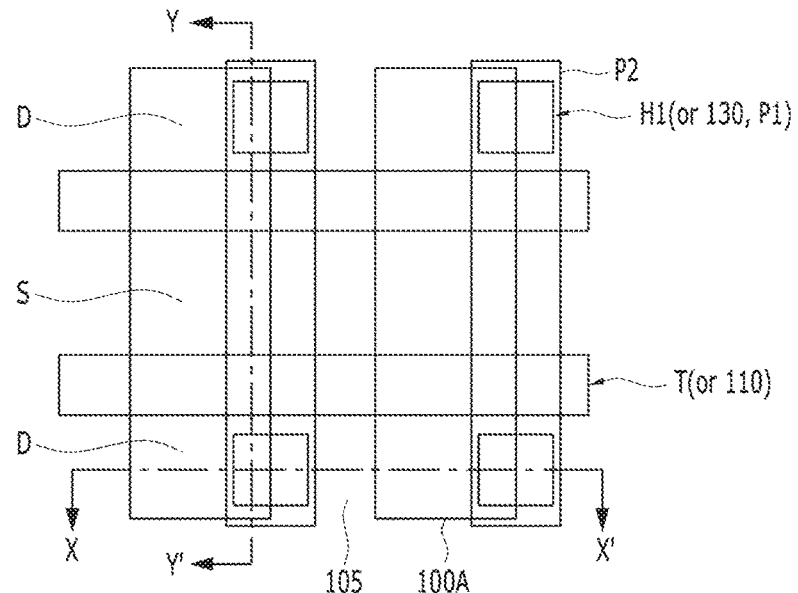
Figure 4B:
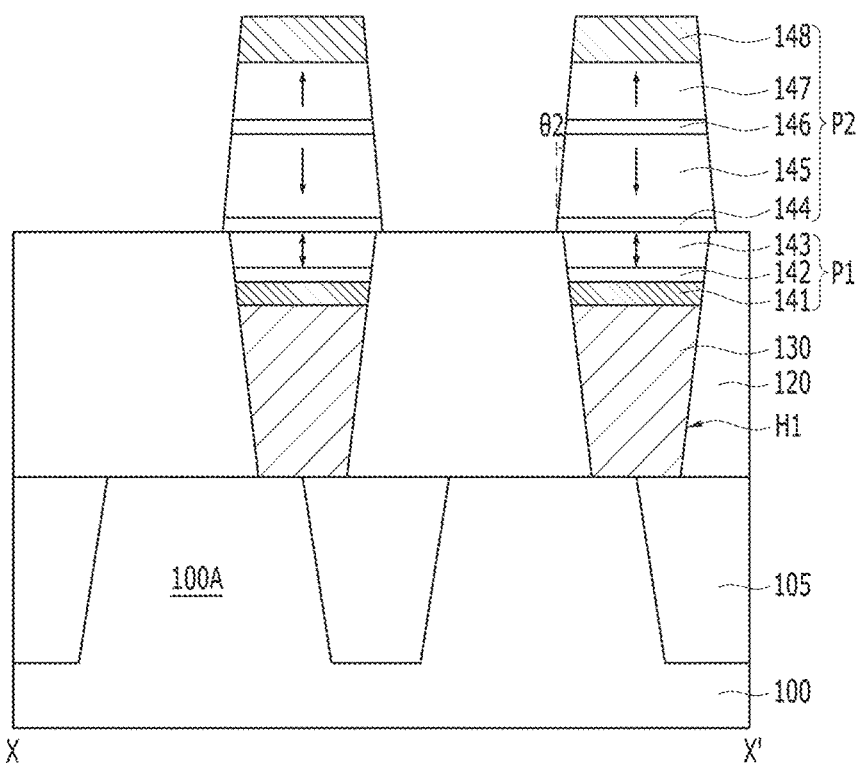
Figure 4C:
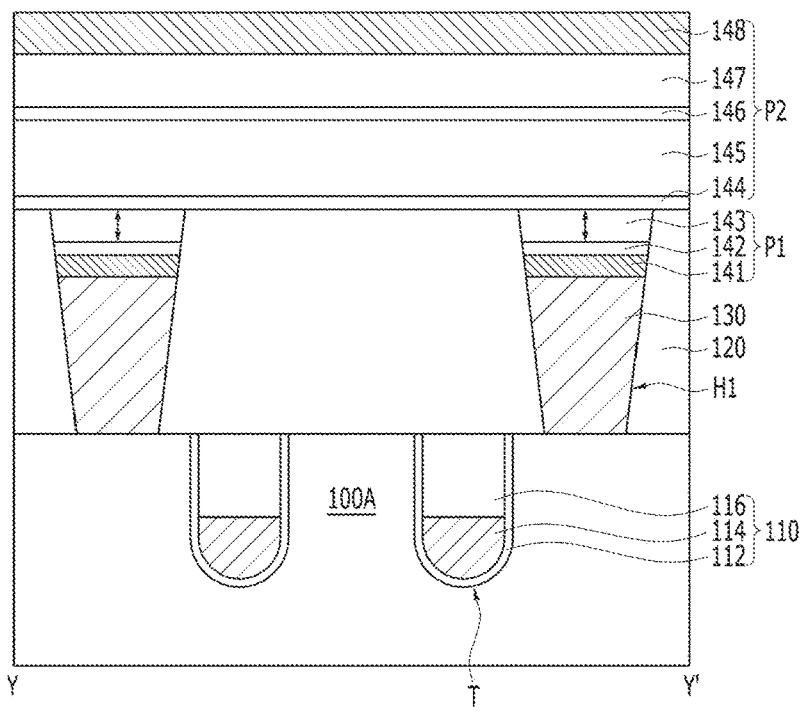

Referring to FIGS. 4A to 4C, a second portion P2 of the variable resistance element may be formed over a resultant structure of FIGS. 3A to 3C.

In this implementation, the second portion P2 may include at least a pinned layer 145 of the MTJ structure. The pinned layer 145 may have a single-layered structure or multi-layered structure which includes a ferromagnetic material. For example, the pinned layer 145 may include an alloy of which a main component is Fe, Ni or Co such as Fe—Pt alloy, Fe—Pd alloy, Co—Fe ally, Co—Pd alloy, Co—Pt alloy, Co—Fe—Ni alloy, Fe—Ni—Pt alloy, Co—Fe—Pt alloy, Co—Ni—Pt alloy, or Co—Fe—B alloy, or a stack structure such as Co/Pt, Co/Pd, etc. As shown in FIG. 4B, a magnetization direction of the pinned layer 145 may be substantially perpendicular to the interface between layers. In this implementation, the magnetization direction of the pinned layer 145 may be fixed in a downward direction. On the other hand, in another implementation, the magnetization direction of the pinned layer 145 may be fixed in an upward direction.

Moreover, the second portion P2 may further include a tunnel barrier layer 144 interposed between the pinned layer 145 and the free layer 143. The tunnel barrier layer 144 may include a single-layered structure or multi-layered structure which includes an oxide such as MgO, CaO, SrO, TiO, VO, or NbO, etc. In this implementation, the tunnel barrier layer 144 may be included in the first portion P2 and have a sidewall aligned with the sidewall of the pinned layer 145. However, in another implementation, the tunnel barrier layer 144 may be filled in the first hole H1 and have a sidewall aligned with the sidewall of the free layer 143.

Moreover, the second portion P2 may further include a magnetic correction layer 147 which is disposed over the pinned layer 145 and offsets or reduces an effect of a stray field generated by the pinned layer 145, and an exchange coupling layer 146 which is interposed and provides an exchange coupling between the magnetic correction layer 147 and the pinned layer 145. Since a biased magnetic field in the free layer 143 due to the stray field of the pinned layer 145 can be reduced by the correcting magnetic field produced by the magnetic correction layer 147, a switching characteristic of the variable resistance element may be improved. The magnetic correction layer 147 may have a magnetization direction anti-parallel to the magnetization direction of the pinned layer 145, for example, an upward magnetization direction. The magnetic correction layer 147 may have a single-layered structure or multi-layered structure including a ferromagnetic material. The exchange coupling layer 146 may couple the pinned layer 145 and the magnetic correction layer 147 to each other so that the magnetization directions of the pinned layer 145 and the magnetic correction layer 147 are anti-parallel to each other, and include a noble metal such as Ru, etc.

Moreover, the second portion P2 may further include an upper electrode layer 148 which is located over the magnetic correction layer 147 and constitutes an uppermost portion of the variable resistance element. The upper electrode layer 148 may be a portion of the variable resistance element, and be distinguished from an upper contact plug (see a reference numeral 170 of FIGS. 5A to 5C) which is coupled to a top end of the variable resistance element for connecting the variable resistance element with other elements. The upper electrode layer 148 may have a single-layered structure or multi-layered structure including a conductive material which has a high electrical conductivity and serves as a hard mask during a patterning process of the second portion P2.

Meanwhile, in this implementation, the second portion P2 may have a line shape extending in the second direction while being coupled to the first portions P1 arranged in the second direction. That is, the second portion P2 may be commonly coupled to the drain regions D of the transistors which are coupled to each other in the second direction.

The second portion P2 may be formed by depositing material layers for the tunnel barrier layer 144, the pinned layer 145, the exchange coupling layer 146, the magnetic correction layer 147 and the upper electrode layer 148 over a resultant structure of FIGS. 3A to 3C, and selectively etching the material layers. This etching process may be performed by a physical etching method such as an IBE (Ion Beam Etching), etc. In some implementations, a width of the second portion P2 along the first direction X-X' may increase from top to bottom in the vertical direction towards the contact plug 130. This spatial profile of the width of P2 is opposite to the spatial profile of the width of the first portion P1 which has a width along the direction X-X' decreasing from top to bottom along the vertical direction towards the contact plug 130. This design of different portions P1 and P2 while etching only the P2 portion can reduce the overall etching-induced slope effect on the MTJ structure. Comparing to the comparative example in FIGS. 1A and 1B, a thickness of the material layers to be etched in one etching process is reduced since the first portion P1 of the variable resistance element is already filled in the first hole H1. That is, the etching process for the second portion P2 is done for the remaining material layers except the first portion P1 and thus, the thickness of the actual etching target is decreased by the first portion P1. This reduced amount to be removed by etching along the vertical direction leads to a reduced sloping effect caused by etching on the final MTJ structure. Specifically, a sidewall of the second portion P2 may be further vertical compared to the sidewall of the variable resistance element of the comparative example (see the reference numeral 14 of FIG. 1B). That is, an angle θ2 between a dotted line perpendicular to the top surface of the semiconductor substrate 100 and the sidewall of second portion P2 may be smaller than that of the comparative example (see the angle θ1 of FIG. 1B). Therefore, reliability or magnetic/electrical characteristics of the variable resistance element may be improved, and efficiency of a data writing operation may increase. In some implementations, a width of the free layer 143 located in the first portion P1 is not greater than a width of the pinned layer 145 located in the second portion P2. Furthermore, it is advantageous to secure a function of the magnetic correction layer 147 which is located at a relatively upper portion. Furthermore, since the second portion P2 has a line shape, the second portion P2 may be patterned using one line-type mask. Therefore, the number of masks may be reduced compared to the comparative example, so processing cost and processing time may decrease.

Although the second portion P2 includes the tunnel barrier layer 144, the pinned layer 145, the exchange coupling layer 146, the magnetic correction layer 147 and the upper electrode layer 148 in this implementation, a configuration of the second portion P2 may be variously modified as long as the second portion P2 includes the pinned layer 145. For example, at least one of the tunnel barrier layer 144, the exchange coupling layer 146, the magnetic correction layer 147 or the upper electrode layer 148 may be omitted in the second portion P2. Alternatively, for example, the second portion P2 may further include an additional layer which is not shown.

Figure 5A:
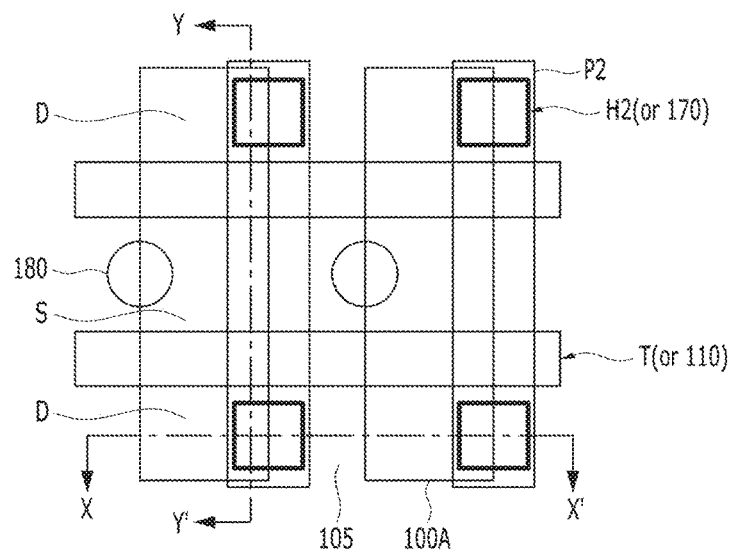
Figure 5B:
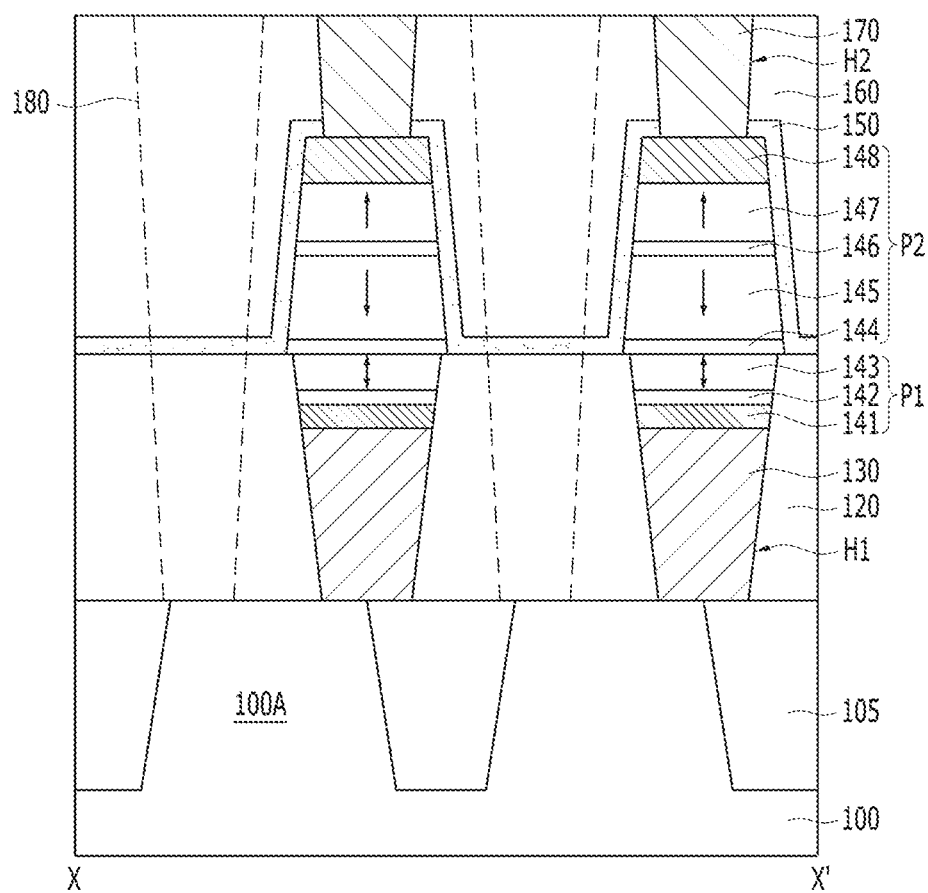
Figure 5C:
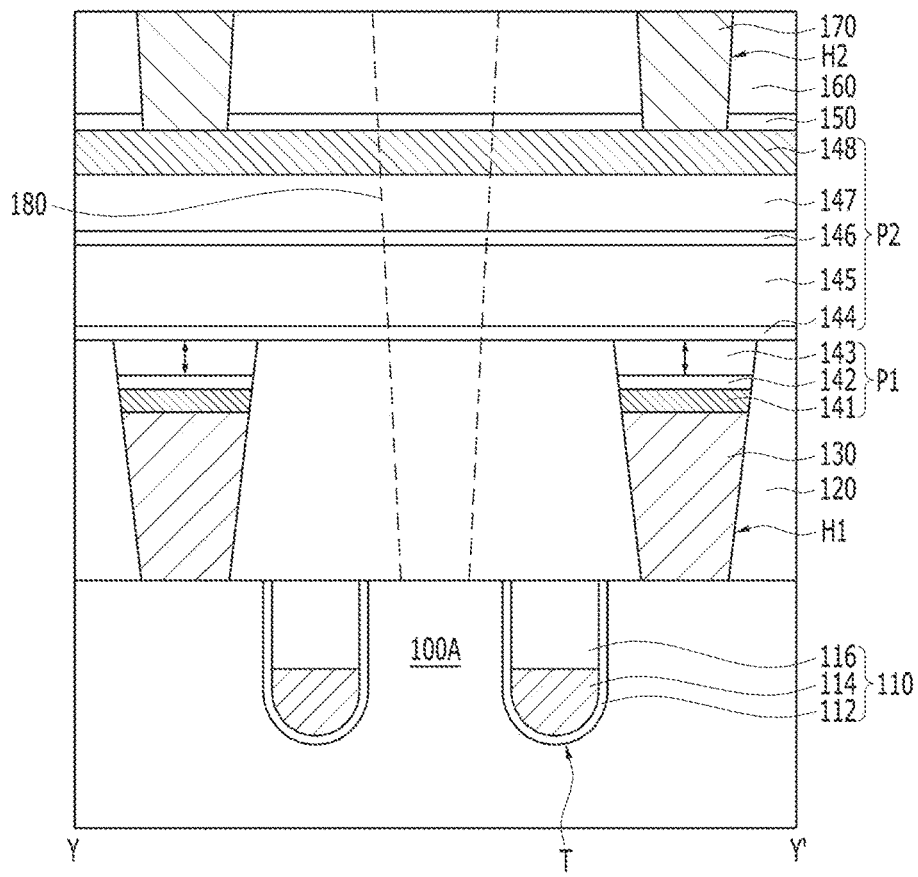

Referring to FIGS. 5A to 5C, a protective layer 150 for protecting the second portion P2 of the variable resistance element may be formed along a resultant structure of FIGS. 4A to 4C, and then, a second interlayer insulating layer 160 may be formed over the protective layer 150. The protective layer 150 may include an insulating material different from the first and second interlayer insulating layers 120 and 160, for example, a silicon nitride, etc. The protective layer 150 may be omitted. The first and second interlayer insulating layers 120 and 160 may include a silicon oxide, etc.

Then, an upper contact plug 170 may be formed to penetrate through the second interlayer insulating layer 160 and the protective layer 150 and be coupled to a top of the second portion P2. The upper contact plug 170 may be formed by forming a second hole H2 which exposes the upper electrode layer 148 by selectively etching the second interlayer insulating layer 160 and the protective layer 150, depositing a conductive material to a thickness sufficient to fill the second hole H2, and performing a planarization process until the top surface of the second interlayer insulating layer 160 is exposed. The upper contact plug 170 may have a single-layered structure or multi-layered structure including a conductive material which has an excellent gap-fill characteristic and a high electrical conductivity, for example, a metal such as W or Ta, or a metal nitride such as TiN, etc.

In this implementation, the upper contact plug 170 may have an island shape to overlap each of the first portions P1. However, in other implementations, the upper contact plug 170 may have a line shape which overlaps each of the second portions P2.

Then, a source line contact plug 180 may be formed to penetrate through the second interlayer insulating layer 160, the protective layer 140 and the first interlayer insulating layer 120 and be coupled to each of the source regions S. Since the source line contact plug 180 is not shown in the cross-sectional views taken along the line X-X' and the line Y-Y', the source line contact plug 180 is represented by a dotted line. The source line contact plug 180 may be formed by forming a hole which exposes the source region S of the active region 100A by selectively etching the second interlayer insulating layer 160, the protective layer 140 and the first interlayer insulating layer 120, depositing a conductive material to a thickness sufficient to fill the hole, and performing a planarization process until the top surface of the second interlayer insulating layer 160 is exposed.

In this implementation, the upper contact plug 170 may be formed, and then, the source line contact plug 180 may be formed. However, other implementations may be also possible. For example, the source line contact plug 180 may be formed, and then, the upper contact plug 170 may be formed. Alternatively, the upper contact plug 170 and the source line contact plug 180 may be formed at the same time.

Figure 6A:
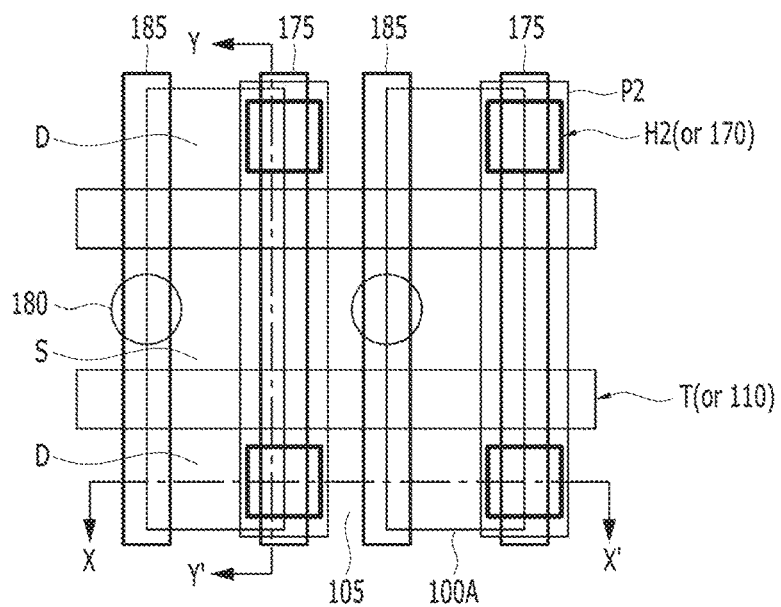
Figure 6B:
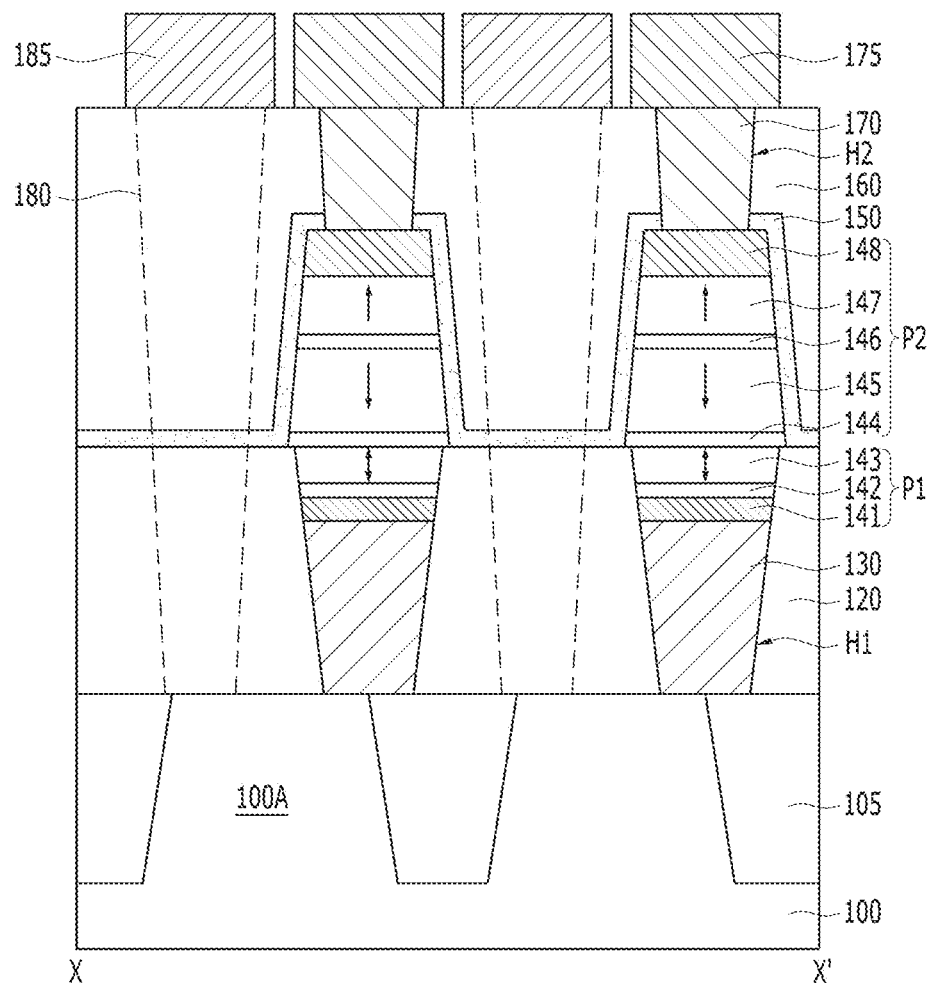
Figure 6C:
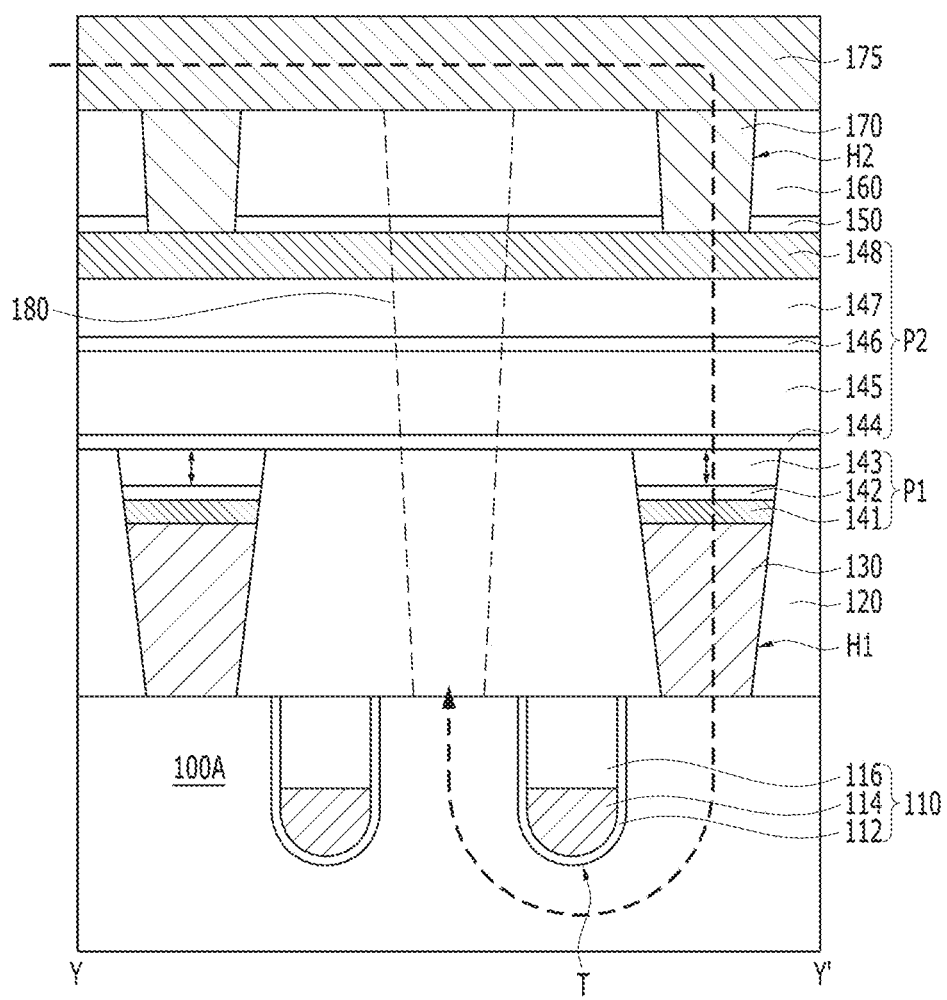

Referring to FIGS. 6A to 6C, a bit line 175 and a source line 185 may be formed over a resultant structure of FIGS. 5A to 5C. The bit line 175 may extend in the second direction and be coupled to the upper contact plugs 170 arranged in the second direction. The source line 185 may extend in the second direction and be coupled to the source line contact plug 170. The bit line 175 and the source line 185 may have a single-layered structure and multi-layered structure including a conductive material such as a metal, a metal nitride, etc. Also, the bit line 175 and the source line 185 may be formed by depositing a conductive material over the resultant structure of FIGS. 5A to 5C, and selectively etching the conductive material.

In this implementation, the bit line 175 may have a line-shape overlapping the second portion P2. In order to be better shown in FIG. 6A, a width of the bit line 175 and a width of the second portion P2 may be different from each other in the first direction. However, the width of the bit line 175 and the width of the second portion P2 may be the same as each other in the first direction. Therefore, etching processes for forming the second portion P2 and the bit line 175 may be performed using a same mask (not shown).

By the aforementioned processes, the semiconductor memory of FIGS. 6A to 6C may be fabricated.

Referring again to FIGS. 6A to 6C, the semiconductor memory may include the transistor which includes the gate structure 110 and the source/drain regions S and D located at the both sides of the gate structure 110, the stack structure of the lower contact plug 130 and the first portion P1 of the variable resistance element which is coupled to the drain region D of the transistor, the second portion P2 of the variable resistance element which extends in a direction and is coupled to the first portion P1 over the first portion P1, the upper contact plug 170 coupled to the second portion P2 over the second portion P2, the bit line 175 which extends in the direction and is coupled to the upper contact plug 170 over the upper contact plug 170, the source line contact plug 180 coupled to the source region S of the transistor, and the source line 185 which extends in the direction and is coupled to the source line contact plug 180 over the source line contact plug 180.

The variable resistance element including the first portion P1 and the second portion P2 may switch between different resistance states according to a voltage or current supplied through the bit line 175 and the source line 185, thereby storing data. When the variable resistance element includes the MTJ structure and the magnetization directions of the free layer 143 and the pinned layer 145 are parallel to each other, the variable resistance element may be in a low resistance state and store data '1'. On the other hand, when the magnetization directions of the free layer 143 and the pinned layer 145 are anti-parallel to each other, the variable resistance element may be in a high resistance state and store data '0'.

Here, the first portion P1 may include at least the free layer 143, and have an island shape by being filled in the first hole H1 together with the lower contact plug 130. On the other hand, the second portion P2 may include at least the pinned layer 145, and have a line shape extending in a direction, for example, in the same direction as the bit line 175. The first portion P1 may have a width which decreases from top to bottom. On the other hand, the second portion P2 may have a width which increases from top to bottom. However, a rate of increase in the width of the second portion P2 may be smaller as that of the comparative example. As previous discussed above, the angle between the sidewall of the second portion P2 forms a smaller angle from the vertical line perpendicular to the top surface of the semiconductor substrate 100 as compared to that of the comparative example and thus, the second portion P2 has a substantially vertical sidewall profile compared to the comparative example.

Meanwhile, although the second portion P2 extends in the second direction, since the first portions P1 are separated from each other in the second direction, it is still possible to select a particular variable resistance element by providing a current flowing through only a corresponding first portion of the particular variable resistance element. Referring to FIG. 6C, while the second portion P2 extends in the second direction Y-Y', the first portions P1 are disposed at the left and right sides. When the variable resistance element having the first portion P1 coupled to the lower contact plug 130 located at the right side is selected, a current flows to pass through a whole of the second portion P2. When the transistor including the gate structure 110 located at the right side is turned on and the transistor located at the left side is turned off, a current flows to pass through the lower contact plug 130 and the first portion P1 that are coupled to the right transistor (see a dotted arrow). Therefore, the magnetization direction of the free layer 143 in the first portion P1 may be changed only in a region that the current flow occurs. In FIG. 6C, a change of the magnetization direction occurs in the first portion P1 located at the right side only and no change of the magnetization direction occurs in the first portion P1 located at the left side.

By the aforementioned semiconductor memory and the method for fabricating the same, following advantages may be obtained.

First, the number of mask processes for patterning the variable resistance element may be reduced. This is because the first portion P1 of the variable resistance element is filled in the first hole H1 in which the lower contact plug 130 is formed and the second portion P2 of the variable resistance element may be patterned using one line-type mask. Furthermore, the second portion P2 may be formed using a mask for forming the bit line 175.

Also, an etching target for forming the variable resistance element may be reduced. This is because the first portion P1 is already filled in the first hole H1. Therefore, an etching process for forming the variable resistance element may be easy, and a vertical sidewall profile of the variable resistance element may be obtained.

Moreover, the sidewall of the free layer 143 included in the first portion P1 may be protected from etching damage.

As a result, processing cost and processing time may be reduced, and various characteristics of the variable resistance element may be improved.

The above and other memory circuits or semiconductor devices based on the disclosed technology can be used in a range of devices or systems. FIGS. 7-11 provide some examples of devices or systems that can implement the memory circuits disclosed herein.

Figure 7:
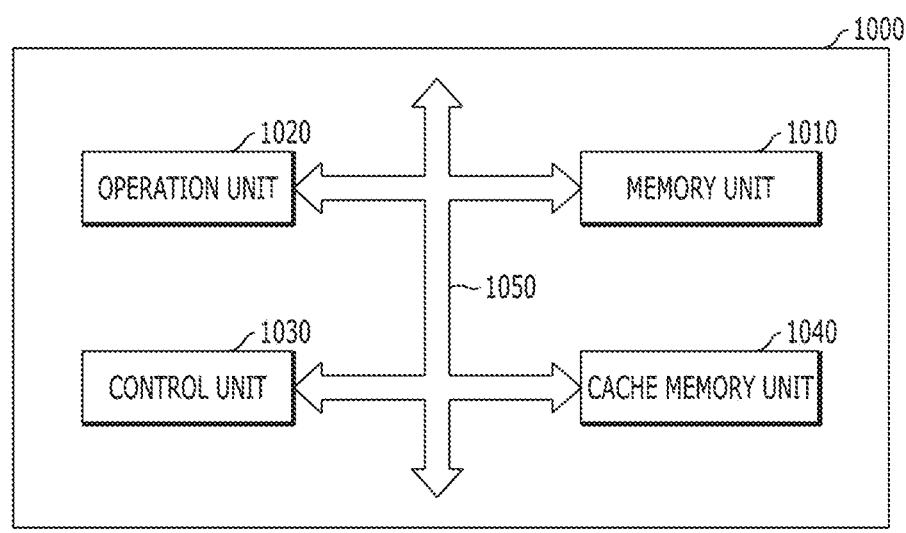
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices.

The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
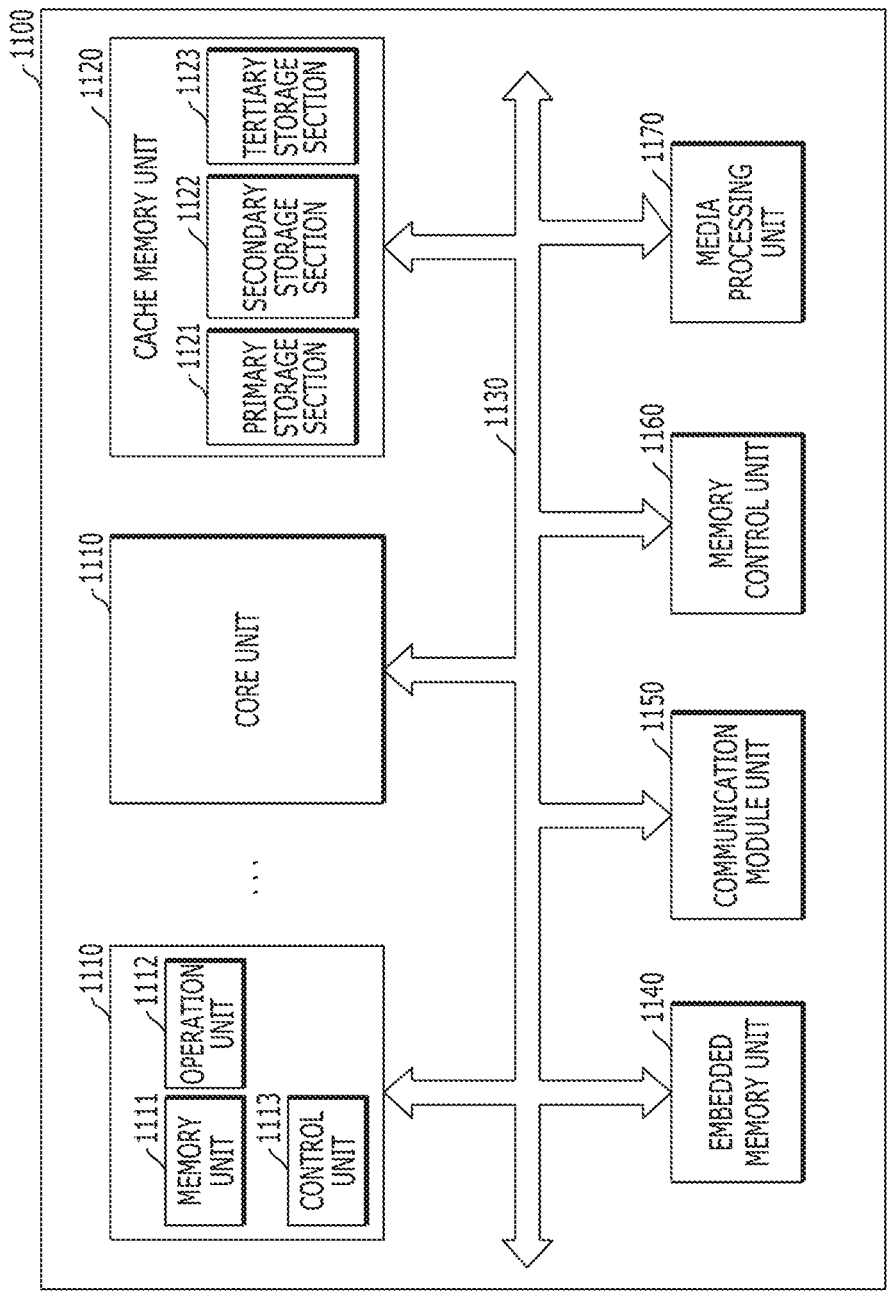
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAIVI), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
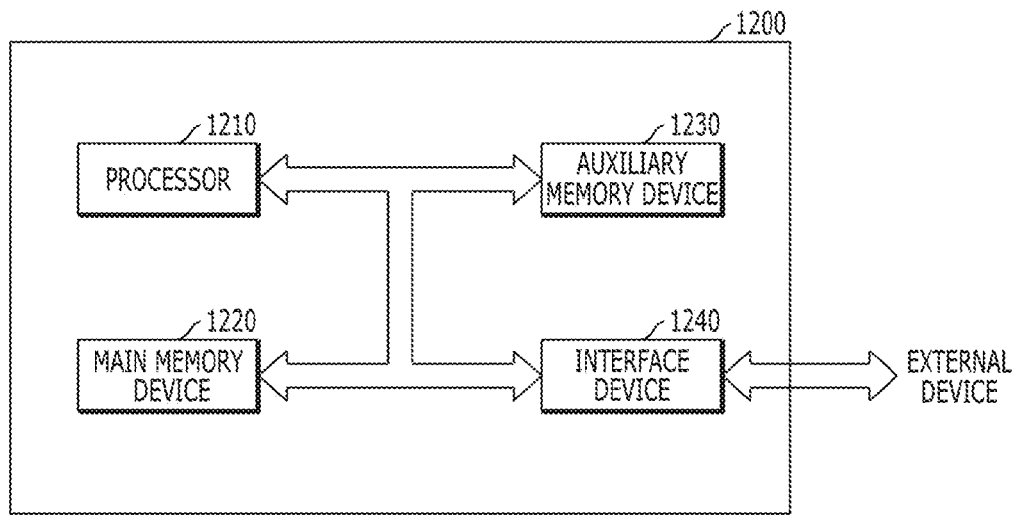
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
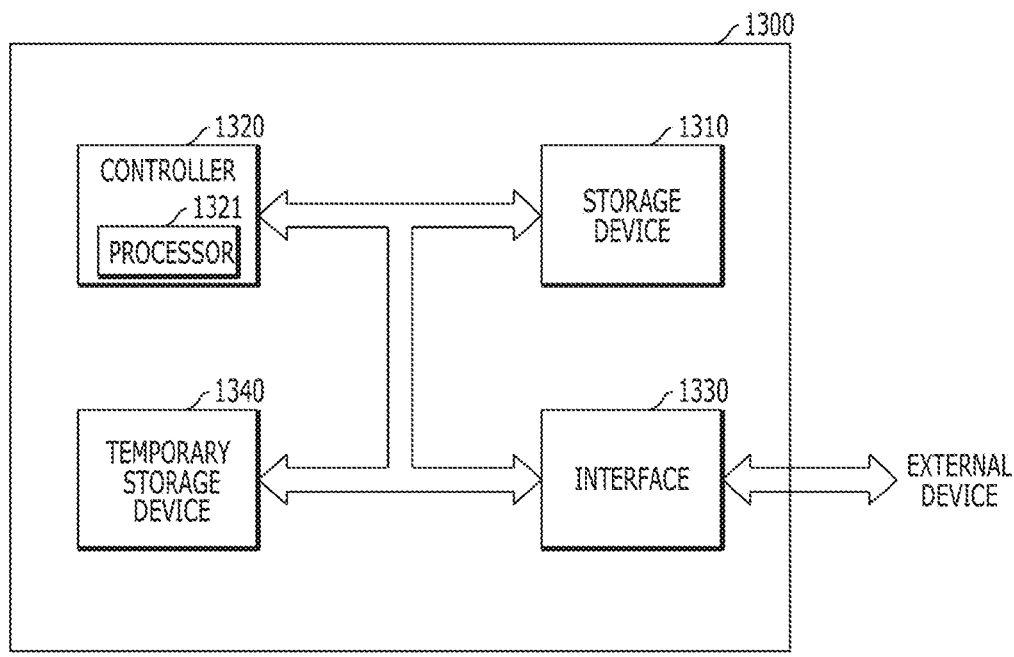
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the storage device 1310 or the temporary storage device 1340 may be improved. As a consequence, operating characteristics and data storage characteristics of the data storage system 1300 may be improved.

Figure 11:
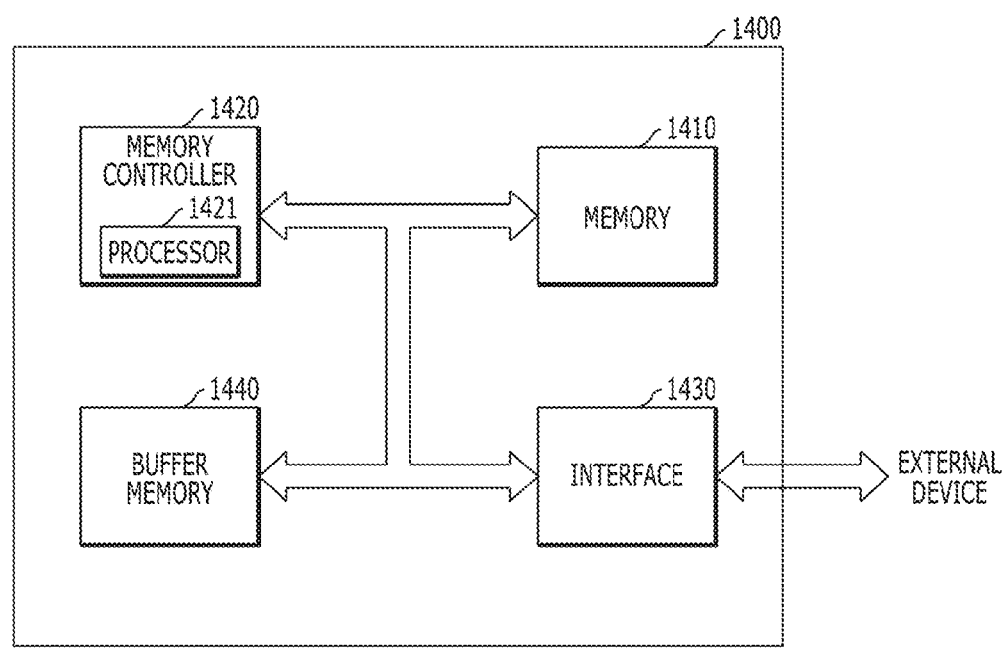
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first portion of a variable resistance element, the first portion having an island shape and including at least a free layer which has a variable magnetization direction; a second portion of the variable resistance element, the second portion having a line shape which extends in a direction over the first portion and including at least a pinned layer which has a pinned magnetization direction; and a tunnel barrier layer interposed between the free layer and the pinned layer. Through this, data storage characteristics and operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
wherein the semiconductor memory comprises:
a variable resistance element including a first portion having a first shape and including a free layer which exhibits a variable magnetization direction, a second portion having a second shape different from the first shape, disposed over the first portion and including a pinned layer with a pinned magnetization direction, and a tunnel barrier layer interposed between the free layer and the pinned layer,
wherein:
the second portion is shaped to extend along an extended direction,
a width of the first portion along a direction perpendicular to the extended direction decreases from a top to a bottom of the first portion along a vertical direction perpendicular to the extended direction, and
a width of the second portion along the direction perpendicular to the extended direction increases from a top of the second portion to a bottom of the second portion along the vertical direction.

2. The electronic device of claim 1, wherein the tunnel barrier layer is included in the first portion and has a sidewall aligned with a sidewall of the free layer.

3. The electronic device of claim 1, wherein the tunnel barrier layer is included in the second portion and has a sidewall aligned with a sidewall of the pinned layer.

4. The electronic device of claim 1, wherein the semiconductor memory further comprises:
a lower contact plug coupled to the first portion under the first portion.

5. The electronic device of claim 4, wherein the lower contact plug has a sidewall aligned with a sidewall of the first portion.

6. The electronic device of claim 1, wherein the semiconductor memory further comprises:
an upper contact plug coupled to the second portion over the second portion.

7. The electronic device of claim 6, wherein the upper contact plug has an island shape overlapping the first portion.

8. The electronic device of claim 6, wherein the upper contact plug has a line shape overlapping the second portion.

9. The electronic device of claim 6, wherein the semiconductor memory further comprises:
a conductive line coupled to the upper contact plug over the upper contact plug while having a line shape which overlaps the second portion.

10. The electronic device of claim 1, wherein the first portion includes a plurality of first portions which are arranged in the direction, and
the second portion commonly overlaps the plurality of first portions.

11. The electronic device of claim 10, wherein the semiconductor memory further comprises:
a plurality of transistors coupled to the plurality of first portions, respectively, and
a magnetization direction of a free layer of a selected first portion of the plurality of first portions, which is coupled to a turned-on transistor of the plurality of transistors, changes.

12. The electronic device of claim 1, wherein the second portion further comprising:
a magnetic correction layer disposed over the pinned layer and offsetting or reducing an effect of a stray field generated by the pinned layer; and
an exchange coupling layer interposed between the pinned layer and the magnetic correction layer.

13. The electronic device of claim 1, wherein the first portion is filled in an interlayer insulating layer, and
the second portion is located over the interlayer insulating layer.

14. The electronic device of claim 1, wherein the first shape is an island shape and the second shape is a line shape.

15. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

16. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

17. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

18. The electronic device of claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

19. The electronic device of claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

20. An electronic device comprising a semiconductor memory, wherein the semiconductor memory comprises:

a lower contact plug;

a variable resistance element disposed on the lower contact plug;

an upper contact plug disposed on the variable resistance element;

a bit line disposed on the upper contact plug, wherein the variable resistance element comprises:

a first portion including a seed layer and a free layer disposed on the seed layer;

a second portion including a pinned layer, an exchange coupling layer disposed on the pinned layer, and a magnetic correction layer disposed on the exchange coupling layer; and a tunneling barrier layer disposed between the first portion and the second portion, wherein the first portion has an island shape and the second portion has a line shape to extend in a horizontal direction in a top view, and a first sidewall of the first portion is negatively sloped, and a second sidewall of the second portion is positively sloped.

* * * * *